(12) United States Patent
Aciicmez et al.

(10) Patent No.: US 7,847,710 B2
(45) Date of Patent: Dec. 7, 2010

(54) INTEGRATING HASHING AND DECOMPRESSION OF COMPRESSED DATA FOR SAFE COMPUTING ENVIRONMENTS AND SYSTEMS

(75) Inventors: Onur Aciicmez, San Jose, CA (US); Jean-Pierre Seifert, Santa Clara, CA (US); Xinwen Zhang, San Jose, CA (US); Afshin Latifi, San Jose, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 98 days.

(21) Appl. No.: 12/268,001

(22) Filed: Nov. 10, 2008

(65) Prior Publication Data

US 2010/0117873 A1 May 13, 2010

(51) Int. Cl.
*H03M 7/34* (2006.01)
*H03M 7/38* (2006.01)
(52) U.S. Cl. .......................................... 341/51; 341/106
(58) Field of Classification Search .................... 341/51, 341/106
See application file for complete search history.

(56) References Cited

U.S. PATENT DOCUMENTS 5,659,737 A * 8/1997 Matsuda .............................. 1/1
5,907,619 A * 5/1999 Davis .......................... 713/176

OTHER PUBLICATIONS

WikiPedia- The Free Encyclopedia, "Java Virtual Machine," http://en.wikipedia.org/wiki/Java_virtual_machine, Downloaded on Mar. 9, 2009, 6 pages.
WikiPedia- The Free Encyclopedia, "Hash function," http://en.wikipedia.org/wiki/Hash_function, Downloaded on Mar. 9, 2009, 7 pages.
WikiPedia- The Free Encyclopedia, "Data compression," http://en.wikipedia.org/wiki/Data_compression, Downloaded on Mar. 9, 2009, 7 pages.
WikiPedia- The Free Encyclopedia, "RSA," http://en.wikipedia.org/wiki/RSA, Downloaded on Mar. 9, 2009, 15 pages.
WikiPedia- The Free Encyclopedia, "Booting," http://en.wikipedia.org/wiki/Booting, Downloaded on Mar. 9, 2009, 11 pages.
WikiPedia- The Free Encyclopedia, "Trusted Computing," http://en.wikipedia.org/wiki/Trusted_Computing, Downloaded on Mar. 9, 2009, 18 pages.

* cited by examiner

*Primary Examiner*—Khai M Nguyen
(74) *Attorney, Agent, or Firm*—Beyer Law Group LLP

(57) ABSTRACT

Techniques for hashing and decompression of data are disclosed. Hashing and decompression of compressed data can be integrated in order to effectively hash and decompress the compressed data at the same time. The integrated hashing and decompression techniques of the invention are useful for any computing environment and/or system where compressed data is hashed and decompressed. The invention is especially useful for safe computing environment and/or system (e.g., a Trusted Computing (TC) computing environment) where hashing decompression of compressed data can be routinely performed. The Integrity of a computing environment and/or system can be protected by integrating the decompressing and hashing of the compressed data or effectively hashing and decompressing the compressed data at the same time. A combined hashing and decompression function can be provided based on conventional hashing and compression functions by integrating their similar components and in an efficient manner.

20 Claims, 9 Drawing Sheets

INTEGRATING HASHING AND DECOMPRESSION OF COMPRESSED DATA FOR SAFE COMPUTING ENVIRONMENTS AND SYSTEMS

BACKGROUND OF THE INVENTION

Conceptually, a computing system (e.g., a computing device, a personal computer, a laptop, a Smartphone, a mobile phone) can accept information (content or data) and manipulate it to obtain or determine a result based on a sequence of instructions (or a computer program) that effectively describes how to process the information. Typically, the information is stored in a computer readable medium in a digital form. More complex computing systems can store content including the computer program itself. A computer program may be invariable and/or built into, for example a computer (or computing) device as logic circuitry provided on microprocessors or computer chips. Today, general purpose computers can have both kinds of programming. A computing system can also have a support system which, among other things, manages various resources (e.g., memory, peripheral devices) and services (e.g., basic functions such as opening files) and allows the resources to be shared among multiple programs. One such support system is generally known and an Operating System (OS) which provides programmers with an interface used to access these resources and services.

Today, numerous types of computing devices are available. These computing devices widely range with respect to size, cost, amount of storage and processing power. The computing devices that are available today include: expensive and powerful servers, relatively cheaper Personal Computers (PC's) and laptops and yet less expensive microprocessors (or computer chips) provided in storage devices, automobiles, and household electronic appliances.

In recent years, computing systems have become more portable and mobile. As a result, various mobile and handheld devices have been made available. By way of example, wireless phones, media players, Personal Digital Assistants (PDA's) are widely used today. Generally, a mobile or a handheld device (also known as handheld computer or simply handheld) can be a pocket-sized computing device, typically utilizing a small visual display screen for user output and a miniaturized keyboard for user input. In the case of a Personal Digital Assistant (PDA), the input and output can be combined into a touch-screen interface.

In particular, mobile communication devices (e.g., mobile phones) have become extremely popular. Some mobile communication devices (e.g., Smartphones) offer computing environments that are similar to that provided by a Personal Computer (PC). As such, a Smartphone can effectively provide a complete operating system as a standardized interface and platform for application developers. Given the popularity of mobile communication devices, telecommunication is discussed in greater detail below.

Generally, telecommunication refers to assisted transmission of signals over a distance for the purpose of communication. In earlier times, this may have involved the use of smoke signals, drums, semaphore or heliograph. In modern times, telecommunication typically involves the use of electronic transmitters such as the telephone, television, radio or computer. Early inventors in the field of telecommunication include Alexander Graham Bell, Guglielmo Marconi and John Logie Baird. Telecommunication is an important part of the world economy and the telecommunication industry's revenue is placed at just under 3 percent of the gross world product.

Conventional telephones have been in use for many years. The first telephones had no network but were in private use, wired together in pairs. Users who wanted to talk to different people had as many telephones as necessary for the purpose. Typically, a person who wished to speak, whistled into the transmitter until the other party heard. Shortly thereafter, a bell was added for signaling, and then a switch hook, and telephones took advantage of the exchange principle already employed in telegraph networks. Each telephone was wired to a local telephone exchange, and the exchanges were wired together with trunks. Networks were connected together in a hierarchical manner until they spanned cities, countries, continents and oceans. This can be considered the beginning of the public switched telephone network (PSTN) though the term was unknown for many decades.

Public switched telephone network (PSTN) is the network of the world's public circuit-switched telephone networks, in much the same way that the Internet is the network of the world's public IP-based packet-switched networks. Originally a network of fixed-line analog telephone systems, the PSTN is now almost entirely digital, and now includes mobile as well as fixed telephones. The PSTN is largely governed by technical standards created by the ITU-T, and uses E.163/E.164 addresses (known more commonly as telephone numbers) for addressing.

More recently, wireless networks have been developed. While the term wireless network may technically be used to refer to any type of network that is wireless, the term is often commonly used to refer to a telecommunications network whose interconnections between nodes is implemented without the use of wires, such as a computer network (which is a type of communications network). Wireless telecommunications networks can, for example, be implemented with some type of remote information transmission system that uses electromagnetic waves, such as radio waves, for the carrier and this implementation usually takes place at the physical level or "layer" of the network (e.g., the Physical Layer of the OSI Model). One type of wireless network is a WLAN or Wireless Local Area Network. Similar to other wireless devices, it uses radio instead of wires to transmit data back and forth between computers on the same network. Wi-Fi is a commonly used wireless network in computer systems which enable connection to the internet or other machines that have Wi-Fi functionalities. Wi-Fi networks broadcast radio waves that can be picked up by Wi-Fi receivers that are attached to different computers or mobile phones. Fixed wireless data is a type of wireless data network that can be used to connect two or more buildings together in order to extend or share the network bandwidth without physically wiring the buildings together. Wireless MAN is another type of wireless network that connects several Wireless LANs.

Today, several mobile networks are in use. One example is the Global System for Mobile Communications (GSM) which is divided into three major systems which are the switching system, the base station system, and the operation and support system (Global System for Mobile Communication (GSM)). A cell phone can connect to the base system station which then connects to the operation and support station; it can then connect to the switching station where the call is transferred where it needs to go (Global System for Mobile Communication (GSM)). This is used for cellular phones and common standard for a majority of cellular providers. Personal Communications Service (PCS): PCS is a radio band that can be used by mobile phones in North America. Sprint happened to be the first service to set up a PCS. Digital Advanced Mobile Phone Service (D-AMPS) is an upgraded version of AMPS but it may be phased out as the newer GSM networks are replacing the older system.

Yet another example is the General Packet Radio Service (GPRS) which is a Mobile Data Service available to users of Global System for Mobile Communications (GSM) and IS-136 mobile phones. GPRS data transfer is typically charged per kilobyte of transferred data, while data communication via traditional circuit switching is billed per minute of connection time, independent of whether the user has actually transferred data or has been in an idle state. GPRS can be used for services such as Wireless Application Protocol (WAP) access, Short Message Service (SMS), Multimedia Messaging Service (MMS), and for Internet communication services such as email and World Wide Web access. 2G cellular systems combined with GPRS is often described as "2.5G", that is, a technology between the second (2G) and third (3G) generations of mobile telephony. It provides moderate speed data transfer, by using unused Time Division Multiple Access (TDMA) channels in, for example, the GSM system. Originally there was some thought to extend GPRS to cover other standards, but instead those networks are being converted to use the GSM standard, so that GSM is the only kind of network where GPRS is in use. GPRS is integrated into GSM Release 97 and newer releases. It was originally standardized by European Telecommunications Standards Institute (ETSI), but now by the 3rd Generation Partnership Project (3GPP). W-CDMA (Wideband Code Division Multiple Access) is a type of 3G cellular network. W-CDMA is the higher speed transmission protocol used in the Japanese FOMA system and in the UMTS system, a third generation follow-on to the 2G GSM networks deployed worldwide. More technically, W-CDMA is a wideband spread-spectrum mobile air interface that utilizes the direct sequence Code Division Multiple Access signaling method (or CDMA) to achieve higher speeds and support more users compared to the implementation of time division multiplexing (TDMA) used by 2G GSM networks. It should be noted that SMS can be supported by GSM and MMS can be supported by 2.5G/3G networks.

Generally, a mobile phone or cell phone can be a long-range, portable electronic device used for mobile communication. In addition to the standard voice function of a telephone, current mobile phones can support many additional services such as SMS for text messaging, email, packet switching for access to the Internet, and MMS for sending and receiving photos and video. Most current mobile phones connect to a cellular network of base stations (cell sites), which is in turn interconnected to the public switched telephone network (PSTN) (one exception is satellite phones).

The Short Message Service (SMS), often called text messaging, is a means of sending short messages to and from mobile phones. SMS was originally defined as part of the GSM series of standards in 1985 as a means of sending messages of up to 160 characters, to and from Global System for Mobile communications (GSM) mobile handsets. Since then, support for the service has expanded to include alternative mobile standards such as ANSI CDMA networks and Digital AMPS, satellite and landline networks. Most SMS messages are mobile-to-mobile text messages, though the standard supports other types of broadcast messaging as well. The term SMS is frequently used in a non-technical sense to refer to the text messages themselves, particularly in non-English-speaking European countries where the GSM system is well-established.

Multimedia Messaging Service (MMS) is a relatively more modern standard for telephony messaging systems that allows sending messages that include multimedia objects (images, audio, video, rich text) and not just text as in Short Message Service (SMS). It can be deployed in cellular networks along with other messaging systems like SMS, Mobile Instant Messaging and Mobile E-mal. Its main standardization effort is done by 3GPP, 3GPP2 and Ope Mobile Alliance (OMA).

The popularity of computing systems, especially mobile communication devices, is evidenced by their ever increasing use in everyday life. Accordingly, techniques for improving their efficiency and/or safety would be useful.

SUMMARY OF THE INVENTION

Broadly speaking, the invention relates to computing systems and computing environments. More particularly, the invention pertains to improved techniques for hashing and decompression of data.

In accordance with one aspect of the invention, hashing and decompression of compressed data can be integrated in order to effectively hash and decompress the compressed data at the same time. The integrated hashing and decompression techniques of the invention are useful for any computing environment and/or system where compressed data is hashed and decompressed. The invention is especially useful for safe computing environment and/or system (e.g., a Trusted Computing (TC) computing environment) where hashing decompression of compressed data can be routinely performed.

In one embodiment, a first discrete portion of compressed data is hashed and decompressed before a second discrete portion of the compressed data is hashed and decompressed. The first and second discrete portions can, for example, respectively represent the first and second halves of the compressed data. It should be noted that hashing the second discrete portion can effectively include updating the initial hash value determined by hashing the first discrete portion. It should also be noted that a decompressed version of the compressed data can be determined based on the decompressed versions of the first and second discrete portions of the compressed data. After hashing and decompressing the first discrete portion of the compressed data, the second discrete portion of the compressed data can be hashed and decompressed, thereby effectively hashing and decompressing the compressed data at the same time to allow determining a final hash value and a decompressed version of the compressed data.

In accordance with another aspect of the invention, integrity of a computing environment and/or system can be protected by integrating the decompressing and hashing of the compressed data or effectively hashing and decompressing the compressed data at the same time. Hashing can be representative of taking an integrity measurement. As such, the hash value of the compressed data can represent or at least be the basis for its integrity value (or integrity measurement). In one embodiment, each one of a plurality of discrete portions of compressed data is decompressed and hashed. More particularly, the plurality of discrete portions are decompressed and hashed, one by one, and in sequence, in order to determine a final hash value for the compressed data and a decompressed version of the compressed data. As such, a hash value and a decompressed version of the compressed data can be determined effectively at the same time. Based on the hash value (or final hash value) of the compressed data, it can be determined whether the compressed data has maintained its integrity. By way of example, the hash value can be compared to its expected value. The use of the decompressed version of data may be allowed if it is determined that the compressed data has maintained its integrity. It should be noted that the decompressed version of the compressed data is available when its integrity is successfully verified. As such, the decompressed version of data can be used as soon as its integrity has been verified.

In accordance with yet another aspect of the invention, a combined hashing and decompression function can be provided based on conventional hashing and compression functions. Those skilled in the art will appreciate that hashing and decompression functions have similarities allowing them to be combined in an efficient manner. More particularly, conventional hashing and decompression functions have similar components (or stages) that can be combined. By way of example, the initialization (or preprocessing) of a hashing (e.g., a SHA_init( ) function) and initialization (or preprocessing) decompression function (e.g., an inflate_init( ) function) can be combined as a single initialization function. Similarly, the completion (or post processing) of conventional hashing and decompression functions can be combined. Moreover, the core functionality of hashing and decompression functions can be combined together to operate on data portions (D1 . . . DN) representing compressed data D, one by one, and in a sequences starting with the first data portion (D1) and ending with the last data portion (DN).

The invention can be implemented in numerous ways, including, for example, a method, an apparatus, a computer readable medium, and a computing system (e.g., a computing device). A computer readable medium can, for example, include at least executable computer program code stored in a tangible form. Several embodiments of the invention are discussed below.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Figure 1A:
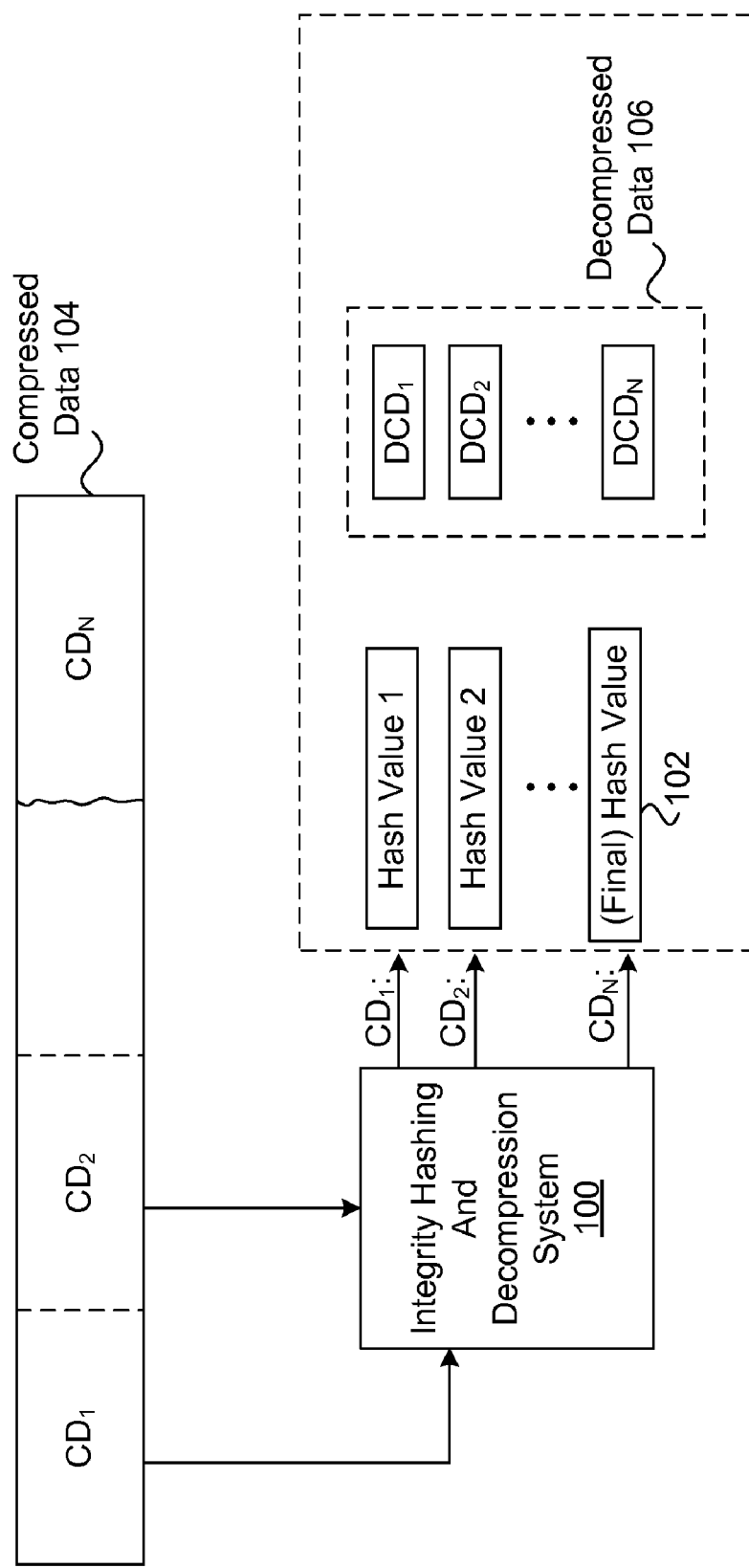
FIG. 1A depicts an integrated hashing and decompression system in accordance with one embodiment of the invention.

As noted in the background section, mobile devices are becoming increasingly more popular. Today, wireless networks and mobile communication devices (e.g., Smartphones, cell phones, Personal Digital Assistants) are especially popular. Unfortunately, however, partly because of this popularity, more and more malicious attacks are being directed to wireless networks and mobile communication devices. In addition, recent developments, including relatively new services (e.g., email, file transfer and messaging), and use of common software platforms (e.g., Symbian, Embedded Linux, and Windows CE operating systems) has made mobile communication devices relatively more exposed to malicious attacks. The exposure to malicious attacks could become worse as the wireless networks and mobile communication devices continue to evolve rapidly. Today, wireless and/or portable communication devices (e.g., cell phones, Smartphones) can offer similar functionality as that more traditionally offered by Personal Computers (PCs). As a result, wireless and/or portable communication devices are likely to face similar security problems (e.g., worms, viruses) as those encountered in more traditional computing environments.

Examples of the most notorious threats to cell phones include the Skull, Cabir, and Mabir worms which have targeted the Symbian operating systems. Generally, an MMS-based worm can start attacking initial targets (hit-list) from the network. Each infected phone can scan its contact list and randomly pick up members to deliver a malicious attack in the form of a message. A person can trust an incoming message due to its attractive title or seemingly familiar source and activate the attached file and unwittingly get a phone infected. The infected phone can in turn get other phones infected, and so on. In contrast, a Blue-tooth based worm can take control of a victim phone's Blue-tooth interface and continuously scan for other Blue-tooth-enabled phones within its range. Once a new target has been detected, the worm can effectively connect to other devices and transfers a malicious message to them, and so on.

Taking the cell phone as an example, an active cell phone typically has two security states: susceptible and infected. A susceptible cell phone is not completely protected against worms and may get infected when exposed to a specific worm (e.g., CommWarrior). An infected cell phone can return back to the susceptible state when the user launches a protection (e.g., the CommWarrior patch from F-Secure or Symantec) partly because the cell phone is susceptible to other worm threats. Malware has many other undesirable affects including compromising the privacy of the users.

Today, security of the computing systems (or devices) is a major concern. Generally, it is important that various components of a computing environment and/or computing system maintain their integrity. As such, integrity of a computing component is crucial to ensuring the security (or safety) of a computing system (e.g., a "trusted" device). A secure system (or device) can, for example, be provided as a trusted system (or device) in accordance with the Trusted Computing (TC) principles primarily developed and promoted by the Trusted Computing Group. In Trusted Computing (TC), verification of integrity can be done by taking "Integrity Measurements" of the content. Integrity of various software components, including operating systems and application programs, can be measured (or taken), for example, by using a cryptographic hash function (or hash function). A hash function can generate a fixed-size string (or hash value) for content (e.g., binary code, text files). Hash values can be securely stored as trusted integrity values (or values that are trusted or believed to be safe). The trusted integrity values can be compared to Integrity values subsequently obtained to taken to ensure the integrity of a computing environment and/or computing system. As such, a trusted integrity value can effectively serve as a point of reference where a deviation would indicate that the integrity has been compromised.

Integrity Measurements (IM) are crucial for providing a Trusted Computing (TC) environment. More generally, providing a safe computing environment typically requires verifying the integrity of various components operating in the computing environment. As such, conventional integrity measurements and verification techniques are highly useful.

However, conventional integrity verification techniques can be costly and/or difficult to implement for some systems. By way of example, in a conventional computing environment and/or system (e.g., a conventional Trusted Computing (TC) environment and/or system) first the integrity of the compressed data is verified. Generally, the compressed data needs to be decompressed before it can be used. As such, only after the integrity of the compressed is successfully verified, conventional computing environments and/or system start the decompression process in order to obtain a decompressed form that can be used (e.g., executed, access other components, be accessed). More particularly, conventionally, compressed data can be initially hashed using a hashing technique. Typically, the compressed data is read piece by piece and hashed. In other words, the hash value is effectively updated as each piece of data of the compressed hashed is hashed sequentially (or in sequence) in order to determine a hash value (or final hash value) for the compressed data. The hash value (or final hash value) calculated for the compressed data can represent the integrity value (or integrity measurement) of the compressed data. As such, the hash value of the compressed data can be compared with its expected hash value (or its expected integrity value) to determine whether the compressed data has maintained its integrity. After the integrity of the compressed data is successfully verified, the decompression process begins to decompress the compressed data.

Given the large number of relatively large components (e.g., operating systems, file systems, and files) that can exist in a modern computing environment in a compressed form, the current trend for use of even larger data sizes including multimedia, and the general desire to further improve the safety of the computing environments by verifying more and more components and more often than not, it will be apparent that the conventional technique of verifying the integrity and decompression separately may not be efficient and/or feasible for at least some computing systems including those that have to operate with relatively less processing power and/or memory. For most systems, malicious and or accidental corruption of data are relatively rare occurrences, and thus it is reasonable to assume that data would have to be compressed more often than not as its compressed form is likely to be successfully verified more often that not.

As such, integration of hashing and decompression operations can generally improve the overall efficiency of a safe computing environment and/or system. In particular, integration of hashing and decompression operations could also allow mobile and/or embedded devices to use integrity verification techniques or improve their existing safety by allowing them to verify larger components and/or perform integrity verification more often.

In addition, those skilled in the art will appreciated that integrating the hashing and decompression of compressed data can effectively curtail the problem of "Time of Check Time Of Use" (TOCTOU) that is typically caused by a defect after the verification of data by effectively reducing the time between verification of the compressed data and availability of its decompressed form for use.

Broadly speaking, the invention relates to computing systems and computing environments. More particularly, the invention pertains to improved techniques for hashing and decompression of data.

In accordance with one aspect of the invention, hashing and decompression of compressed data can be integrated in order to effectively hash and decompress the compressed data at the same time. The integrated hashing and decompression techniques of the invention are useful for any computing environment and/or system where compressed data is hashed and decompressed. The invention is especially useful for safe computing environment and/or system (e.g., a Trusted Computing (TC) computing environment) where hashing decompression of compressed data can be routinely performed.

In one embodiment, a first discrete portion of compressed data is hashed and decompressed before a second discrete portion of the compressed data is hashed and decompressed. The first and second discrete portions can, for example, respectively represent the first and second halves of the compressed data. It should be noted that hashing the second discrete portion can effectively include updating the initial hash value determined by hashing the first discrete portion. It should also be noted that a decompressed version of the compressed data can be determined based on the decompressed versions of the first and second discrete portions of the compressed data. After hashing and decompressing the first discrete portion of the compressed data, the second discrete portion of the compressed data can be hashed and decompressed, thereby effectively hashing and decompressing the compressed data at the same time to allow determining a final hash value and a decompressed version of the compressed data.

In accordance with another aspect of the invention, integrity of a computing environment and/or system can be protected by integrating the decompressing and hashing of the compressed data or effectively hashing and decompressing the compressed data at the same time. Hashing can be representative of taking an integrity measurement. As such, the hash value of the compressed data can represent or at least be the basis for its integrity value (or integrity measurement). In one embodiment, each one of a plurality of discrete portions of compressed data is decompressed and hashed. More particularly, the plurality of discrete portions are decompressed and hashed, one by one, and in sequence, in order to determine a final hash value for the compressed data and a decompressed version of the compressed data. As such, a hash value and a decompressed version of the compressed data can be determined effectively at the same time. Based on the hash value (or final hash value) of the compressed data, it can be determined whether the compressed data has maintained its integrity. By way of example, the hash value can be compared to its expected value. The use of the decompressed version of data may be allowed if it is determined that the compressed data has maintained its integrity. It should be noted that the decompressed version of the compressed data is available when its integrity is successfully verified. As such, the decompressed version of data can be used as soon as its integrity has been verified.

In accordance with yet another aspect of the invention, a combined hashing and decompression function can be provided based on conventional hashing and compression functions. Those skilled in the art will appreciate that hashing and decompression functions have similarities allowing them to be combined in an efficient manner. More particularly, conventional hashing and decompression functions have similar components (or stages) that can be combined. By way of example, the initialization (or preprocessing) of a hashing (e.g., a SHA_init( ) function) and initialization (or preprocessing) decompression function (e.g., an inflate_init( ) function) can be combined as a single initialization function. Similarly, the completion (or post processing) of conventional hashing and decompression functions can be combined. Moreover, the core functionality of hashing and decompression functions can be combined together to operate on data portions (D1 . . . DN) representing compressed data D, one by one, and in a sequences starting with the first data portion (D1) and ending with the last data portion (DN).

Embodiments of these aspects of the invention are discussed below with reference to FIGS. 1A-5. However, those skilled in the art will readily appreciate that the detailed description given herein with respect to these figures is for explanatory purposes as the invention extends beyond these limited embodiments.

FIG. 1A depicts an integrated hashing and decompression system 100 in accordance with one embodiment of the invention. The integrated hashing and decompression system 100 can, for example, be provided for a computing environment and/or computing system (e.g., a personal computer, a mobile phone). It will be appreciated that the integrated hashing and decompression system 100 is operable to effectively hash and decompress the compressed data 104 at the same time. Referring to FIG. 1A, the integrated hashing and decompression system 100 is operable to determine a hash value (or final hash value) 102 for the compressed data 104 and decompress the compressed data 104 to determine a decompressed version of the compressed data 104, namely, the decompressed data 106. It should be noted that the integrated hashing and decompression system 100 is operable to effectively decompress the compressed data 104 as it hashes the compressed data 104. More particularly, the integrated hashing and decompression system 100 can be operable to process each one of the plurality of the compressed data portions ($CD_1$, . . . , $CD_n$) of the compressed data 104, one by one, in order to determine the final hash value 102 and the decompressed data 106.

In other words, the integrated hashing and decompression system 100 can process a first data portion $CD_1$ of the compressed data 104 in order to determine a first hash value for the compressed data 104 and decompress the compressed data portion $CD_1$ in order to determine a decompressed data portion ($DCD_1$). After processing the first compressed data portion $CD_1$, the integrated hashing and decompression system 100 can process a second data portion $CD_2$ in order to determine a second hash value for the compressed data 104 (or update the first hash value) and decompress the second compressed data portion $CD_2$ in order to determine the second decompressed data portion $DCD_2$, and so on. After processing the last compressed data portion $CD_N$, the integrated hashing and decompression system 100 can determine the final hash value 102 for the compressed data 104. In addition, after decompressing the last compressed data portion $CD_N$, the decompressed version of the compressed data 104, namely, the decompressed data 106, can be determined by effectively concatenating the decompressed data portions ($DCD_1$, $DCD_N$).

It should be note that the integrated hashing and decompression system 100 can be operable to effectively divide (or partition) the compressed data 104 into a plurality of compressed data portions ($CD_1$, . . . , $CD_N$) of equal or varied sizes for processing. By way of example, the compressed data 104 can be divided in accordance with the specific hashing algorithm used. Those skilled in the art will readily appreciate that the integrated hashing and decompression system 100 can effectively obtain (e.g., receive, read, load) and/or store the compressed data 104 and/or the decompressed data 106 into a computer readable storage medium (not shown). Furthermore, the integrated hashing and decompression system 100 can include hardware and/or software components, including one or more processors that are operable, configured and/or adapted, to effectively hash and decompress the compressed data 104 at the same time.

It should be noted that the determining of a hash value for a data portion CDI and decompression of the same data portion CDI can be performed in parallel using, for example, two processors or a dual-core processor. It will also be appreciated that the integrated hashing and decompression system 100 is especially useful for integrity verification in safe computing environment and/or systems (e.g., Trusted Computing (TC) environments and systems) where the final hash value 102 can effectively represent an integrity value or be used to determine an integrity value for the compressed data 104. As such, the integrated hashing and decompression system 100 can effectively be used for determining an integrity value for the compressed data 104. Moreover, the integrated hashing and decompression system 100 can effectively decompress the compressed data 104 as hash value needed for integrity verification is being determined, thereby allowing integrity verification and decompression of compressed data to be performed at the same time. In other words, the decompressed data 106 would be readily available and can be used after its integrity has been successfully verified. Generally, data may be partitioned into two or more portions, or two or more data portions can be effectively selected and/or identified for processing.

Generally, the integrated hashing and decompression system 100 can be used in any application where hashing and decompression of data are needed. Integrated hashing and decompression system 100 can effectively integrate and/or combine the hashing and decompression of compressed data.

Figure 1B:
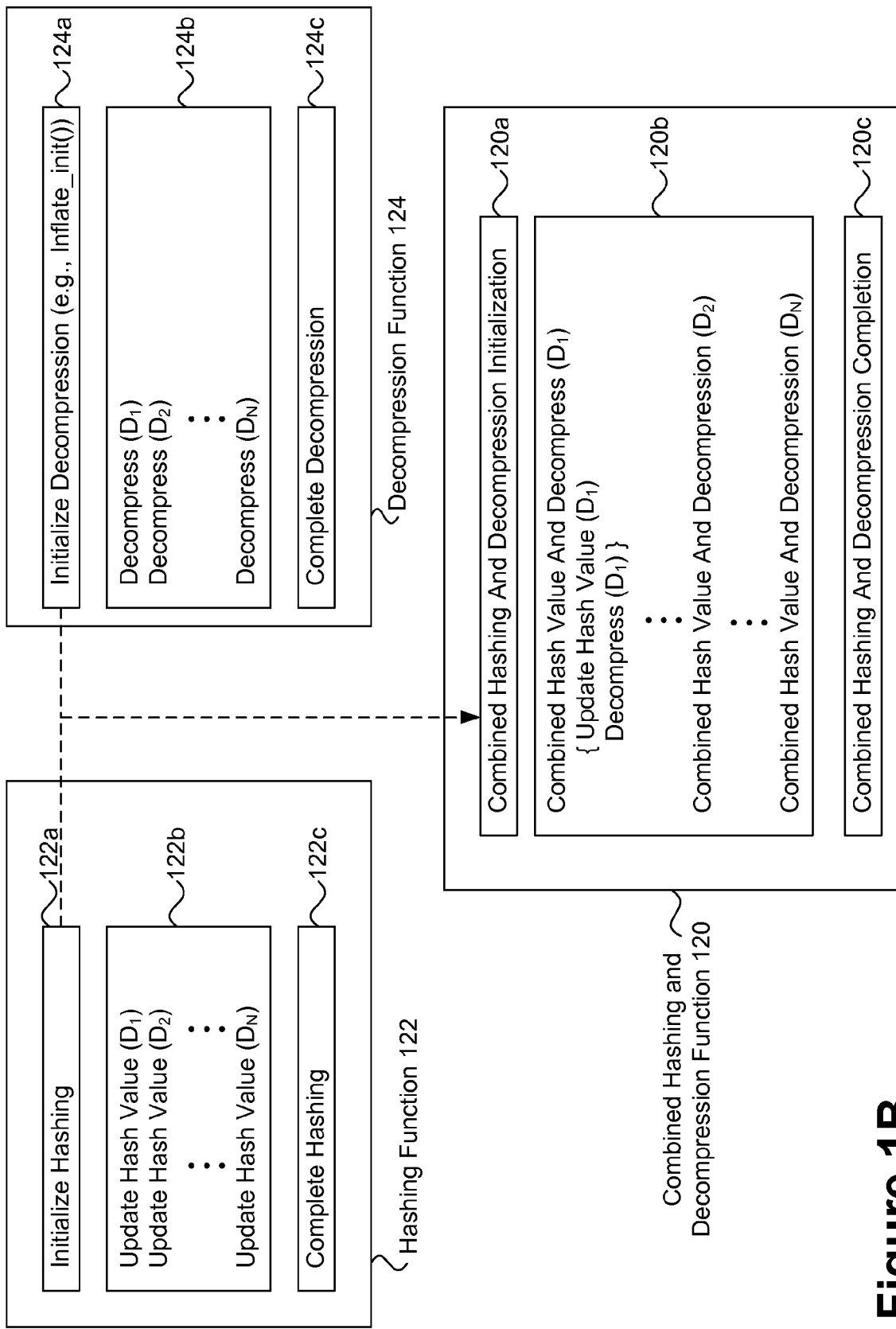
FIG. 1B depicts a combined hashing and decompression function (e.g., module, procedure) in accordance with one embodiment of the invention.

To further elaborate, FIG. 1B depicts a combined hashing and decompression function (e.g., module, procedure) 120 in accordance with one embodiment of the invention. Referring to FIG. 1B, the combined hashing and decompression function 120 is presented in three parts (or stages). Those skilled in the art will appreciate that each of the parts (or stages) of the combined hashing and decompression function 120 can represent an integrated form of the parts (or stages) of the hashing function 122 and decompression function 124. More particularly, the combined hashing and decompression initialization part (or stage) 120a effectively combines and initialize hashing function 122a and initialize decompression function 124a. Those skilled in the art will readily appreciate that the initialize hashing function 122a can, for example, represent any number of "SHA-Init" functions, such as, functions for SHA-0, SHA-1, SHA-224, SHA-256, SHA-384 and SHA-512. Similarly, the initialize decompression functions 124a can represent, for example, an "Inflate-Init" function which can be used for initialization (or preprocessing) operations (e.g., initializing the data structures) for decompression of data, as will be known to those skilled in the art.

Initialize hashing and initialize decompression functions (122a and 124a) can, for example, be implemented as wrapper functions, whereas the core functionality for hashing and decompression operations are respectively represented as 122b and 124b in FIG. 1B. Referring to FIG. 1B, an update hash value function 122b can effectively update the hash values based on the data portions ($D_1$, . . . , $D_N$) in order to compute the hash value (or digest value) of the compressed data D. The update hash value function 122b can, for example, represent various SHA family hash functions including, for example, SHA1_update, SHA128_update, and so on. The decompress function 124b can, for example, be representative of compression (or deflation) algorithms used by "gzip," "zip," and "zlib," which are known variations of LZ77 (Lempel-Ziv1977) widely used in various systems including Linux-based systems. It will be appreciated that the similarities of the hashing and decompression functions (122a and 124a) can be utilized to provide the combined hashing and decompression function 120, operating to update a hash value based on a data portion (Di) and decompress the data portion (Di). It should be noted that the decompression of a data portion Di can be done before, after, or in parallel with hashing it (or determining its value). However, as shown in FIG. 1B, the combined hashing and decompression function 120b processes each compressed data portion Di in sequence and one by one, starting at the first data portion $D_1$, moving to the second data portion $D_2$, and ending with the last data portion $D_N$.

Subsequently, the combined hashing and decompression completion function 120c can effectively complete both the hashing and decompression of the compressed data D. The combined hashing and decompression completion function 120c effectively combines the complete hashing function 122c and complete decompression function 124c. The complete hashing function (or post processing) 122c can, for example, represents the completion part (or post processing) or various hashing functions or algorithms including, for example, SHA1_final( ), SHA256_final( ), and so on. Similarly, the complete decompression part (or post processing) 124c can, for example, represent the completion part (or post processing) for various decompression or inflation functions or algorithms including, for example, inflate( ), as will be known to those skilled in the art.

After the combined hashing and decompression completion 120c, a final hashing value (or digest value) and a decompressed version for the compressed data D can be determined. As noted above, the size of the message portions (or partitions or segments) ($D_1, \ldots, D_N$) of the compressed data D can vary. However, it may be beneficial to partition the decompressed data D into portions that can each be processed in cache memory individually. Compressed data D can be partitioned into data portions in accordance with the specific hashing algorithm being used to hash the compressed data. Typically, compressed data D is partitioned into equal size data portions for hashing. Each of the data portions (also known as partitions or message blocks) can, for example, be divided into 512 bits for SHA-1, SHA-256, 1024 bits for SHA-512 and SHA-384, and so on. As such, if it is desired, equal size data portions ($D_1, \ldots, D_N$) can be used as parameters to the combined hash value and decompression function 120b. Those skilled in the art will readily appreciate that for the sake of simplicity, various details including the number of parameters of the hashing function 122, decompression function 124, and combined hash value and decompression function 120 are neither discussed nor shown in FIG. 1B.

Figure 1C:
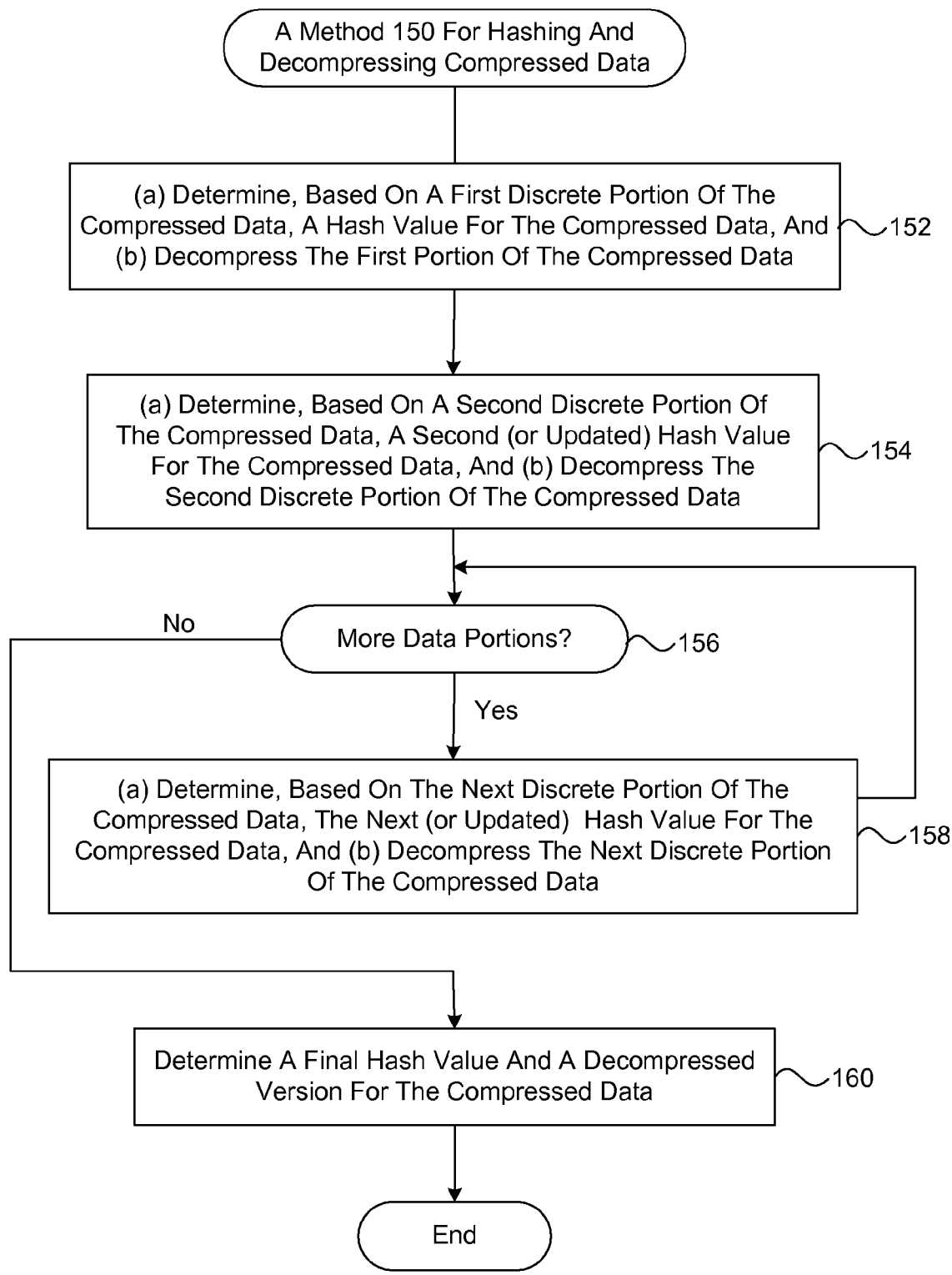
FIG. 1C depicts a method for hashing and decompressing compressed data in accordance with one embodiment of the invention.

FIG. 1C depicts a method 150 for hashing and decompressing compressed data in accordance with one embodiment of the invention. The method 150 can, for example, be performed by the integrated hashing and decompression system 100 depicted in FIG. 1A. Referring to FIG. 1C, initially, a hash value for the compressed data is determined (152) based on a first portion of the compressed data. In addition, the first portion of the compressed data is decompressed. In other words, the first portion of the compressed data is hashed and decompressed (152). The first portion of the compressed data can represent a partition (or a segment) of the compressed data designated for hashing and decompression. After the first portion of the compressed data is hashed and decompressed (152), a second hash value is determined (154) for the compressed data based on the second portion of the compressed data. In other words, the hash value determined (152) based on the first portion of the compressed data is effectively updated based on the second portion of the compressed data. In addition, the second portion of the compressed data is decompressed (154). Typically, the first and second portions of the compressed data represent two discrete data portions of the compressed data. In other words, the decompressed data can be divided for processing into a plurality of discrete data portions that can collectively represent the compressed data. Generally, data may be partitioned into two or more portions, or two or more data portions can be effectively selected and/or identified for processing. After processing of the first and second data portions (154), it can be determined (156) whether to process one or more data portions of the compressed data. If the compressed data is divided into a plurality of discrete data portions (e.g., data portions that do not overlap), determination (156) of whether to process more data portions (156) can simply determine whether there is a third portion of the compressed data to process, and so on. Generally, if it is determined (156) to process a data portion to process, the next portion of the compressed data is hashed and decompressed (158). In effect, the method 150 can proceed to determine the hash value and decompress tow or more data portions until it is determined (156) not to process any more data portion. If it is determined (156) not to process any more data portions, the final hash value and the decompressed version of the compressed data can be determined (160).

As noted above, a hash value for compressed data can effectively serve as an integrity value and/or can be the basis for determining an integrity value for the compressed data.

Figure 2A:
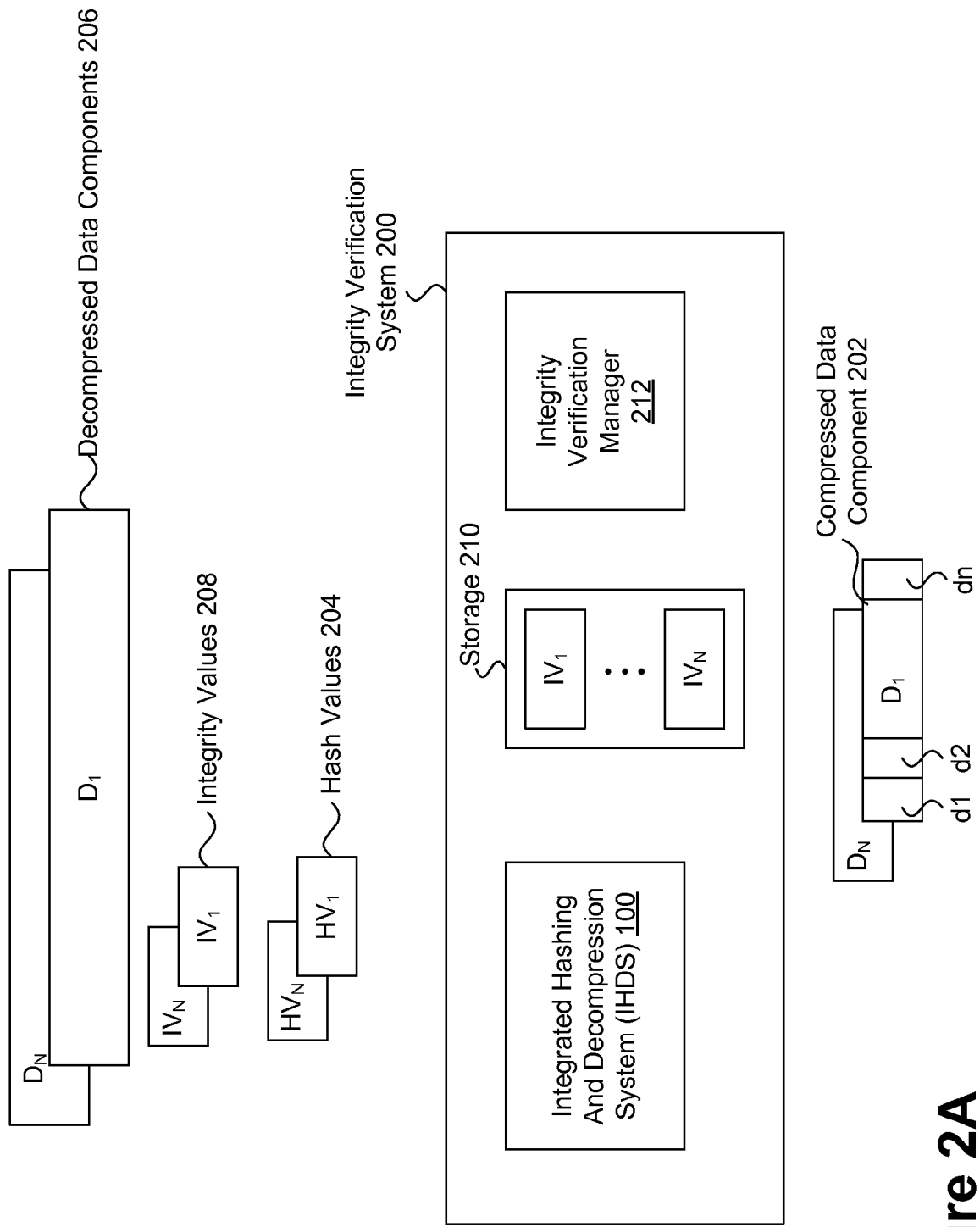
FIG. 2A depicts an integrity verification system in accordance with one embodiment of the invention.

To further elaborate, FIG. 2A depicts an integrity verification system 200 in accordance with one embodiment of the invention. Referring to FIG. 2A, the integrity verification system 200 includes an Integrity Hashing and Decompression System (IHDS) 100 (also shown in FIG. 1A). The IHDS 100 can effectively combine the hashing and decompression functions in order to both hash and decompress one or more compressed data components (e.g., executable codes, files) 202 to determine one or more hash values 204 and one or more decompressed data components 206 corresponding to the compressed data components 202. Generally, the IHDS 100 can determine a hash value 204 for a compressed data component 202 based on a plurality of data portions (segments or partitions) ($D_1 \ldots D_N$). Typically, for integrity measurement and verification, the entire data Di is considered in determining the hash value 204. As such, a compressed data component 202 can be effectively divided into a plurality of discrete data portions that collectively make up the compressed data component 202. In any case, the IHDS 100 can operate to determine a hash value 204 and a decompressed version 206 of a compressed data component 202 (Di) effectively at the same time or together. As will be appreciated by those skilled in the art, a hash value 204 can be directly used as an integrity value 208 or it can be transformed to an integrity value 208. Typically, a hash value 204 is the same as an integrity value 208. An integrity value 208 can be stored in a storage 210 provided for the integrity verification system 200, as shown in FIG. 2A. Typically, the integrity values ($IV_1, \ldots, IV_N$) 208 are stored in a secure storage 210 or a secure portion thereof.

In addition to the Integrity Hashing and Decompression System (IHDS) 100, the integrity verification system 200 can include an integrity verification manager 212 operable to effectively manage the verification of various compressed data components 202 ($D_1, \ldots, D_N$). The integrity verification manager 212 can be operable to communicate with the Integrity Hashing and Decompression System (IHDS) 100 and effectively cause the IHDS 100 to determine a hash value and decompress a compressed data component Di 202. In order to verify the integrity of the compressed data component 202, the integrity verification manager 212 can effectively compare a determined (e.g., the current) integrity value 208 with an expected integrity value. An expected integrity value can, for example, be stored in the storage 210 and effectively represent a value which is known or believed to be representative of a safe (e.g., a trusted) version of a compressed data component 202. If the integrity verification manager 212 can successfully verify the integrity of a compressed data component 202, the integrity verification manager 212 can allow the use of the decompressed version 206 of the compressed data component 202. However, if the integrity of the compressed data cannot be verified by the integrity verification manager 212, remedial action can be taken. Typically, the integrity verification manager 212 does not allow the use of the decompressed version 206 of the compressed data component 202 in order to ensure the safety of the computing environment and/or system associated with the integrity verification system 200.

As it will be appreciated by those skilled in the art, the integrity verification system 200 can be provided for various computing devices including a mobile device (e.g., a cell phone, a smart phone, a Personal Distant Assistant). Furthermore, the integrity verification system 200 can include various hardware and/or software components including one or more processors and memory (not shown). It should be noted that the decompressed version 206 of the compressed data component 202 is readily available after successful verification of the integrity of the compressed data component 202. In other words, there is no need to decompress the compressed data component 202 after its integrity has been verified. As such, the integrity verification system 200 can significantly enhance the performance of a computing environment and/or computing system.

The Integrity Hashing and Decompression System (IHDS) 100 can also obviate other problems, including "TOCTOU" which is generally known as a "Time of Check Time of use" problem (e.g., a software "bug" caused by a defect introduced in the code after the verification and authorization of the code). This problem can, for example, occur as a result of the compressed data being defected and/or corrupted after its integrity has been successfully verified but prior to using its decompressed version. It will be appreciated that by effectively integrating hashing and decompression, the decompressed data can be readily available when the integrity of the data is verified. Thus, the problem of TOCTOU can be significantly reduced.

Figure 2B:
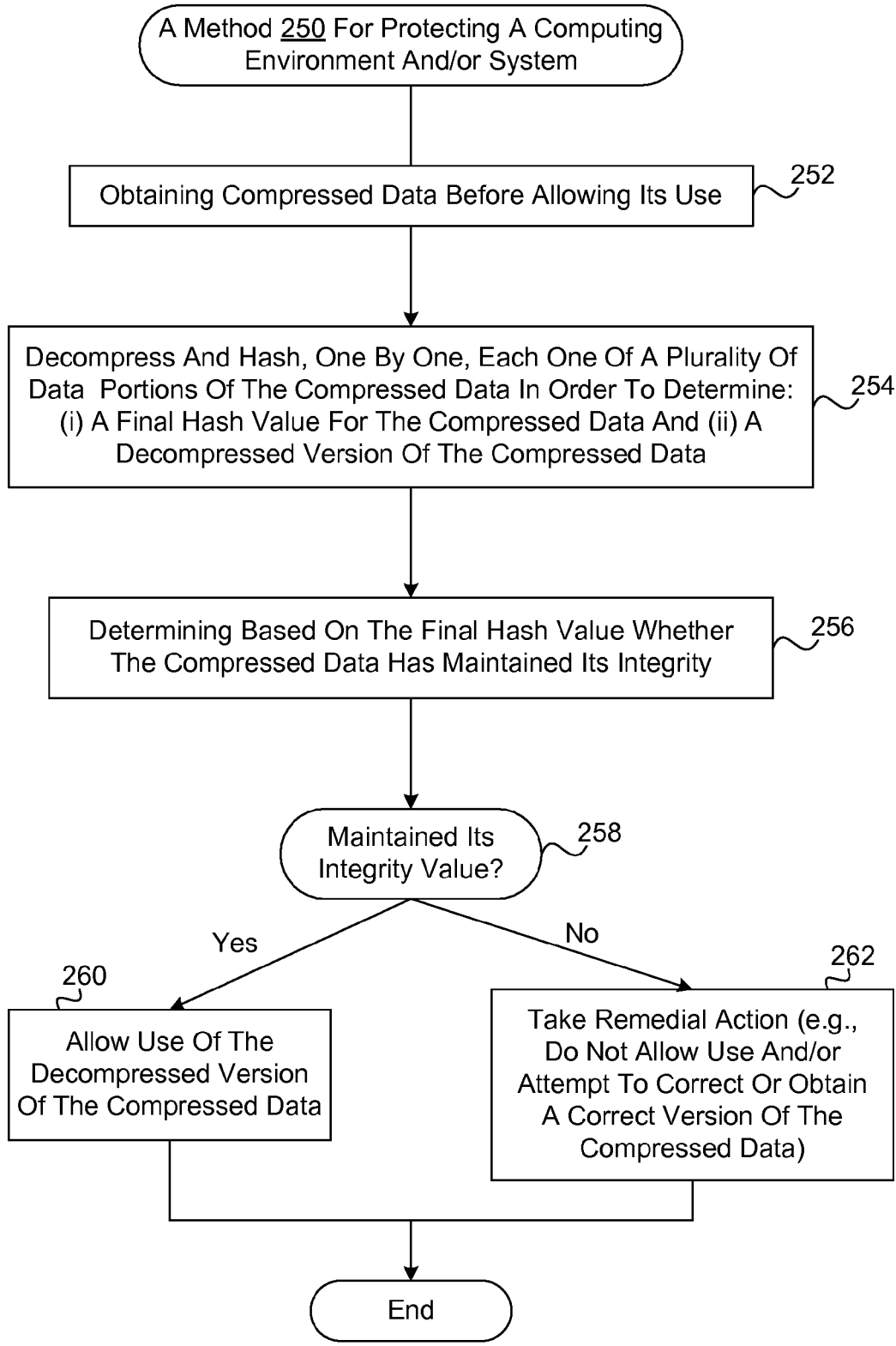
FIG. 2B depicts a method for protecting a computing environment and/or a computing system in accordance with one embodiment of the invention.

FIG. 2B depicts a method 250 for protecting a computing environment and/or a computing system in accordance with one embodiment of the invention. Method 250 can, for example, be performed by the integrity verification system 200 depicted in FIG. 2A in order to effectively protect and/or provide a safe computing environment and/or system. Referring to FIG. 2B, initially, compressed data is obtained (252). More particularly, the compressed data is obtained for integrity verification and decompression (252) before allowing its use in the computing environment and/or system. Next, each one of the plurality of the data portions of the compressed data are decompressed and hashed one by one (254). As a result, the final hash value and a decompressed version are determined for the compressed data. Thereafter, it is determined (256), based on the final hash value, whether the compressed data has maintained its integrity. Consequently, if it is determined (258) that the compressed data has maintained its integrity, the use of the decompressed version of the compressed data is allowed. It should be noted that the decompressed version of the compressed data is readily available after the integrity of the final hash value has been successfully verified. As such, there is no need to decompress the compressed data before allowing its use or using it. On the other hand, if it is determined (258) that the final hash value has not maintained its integrity, remedial action can be taken. Typically, as a remedial action, the use of the decompressed version of the compressed data is not allowed, if it is determined (258) that the compressed data has not maintained it integrity. In addition, an attempt can be made to correct and/or obtain a correct version of the compressed data in order to remedy the situation. Method 250 ends, following allowing (260) use of the compressed data or taking (262) remedial actions.

Figure 2C:
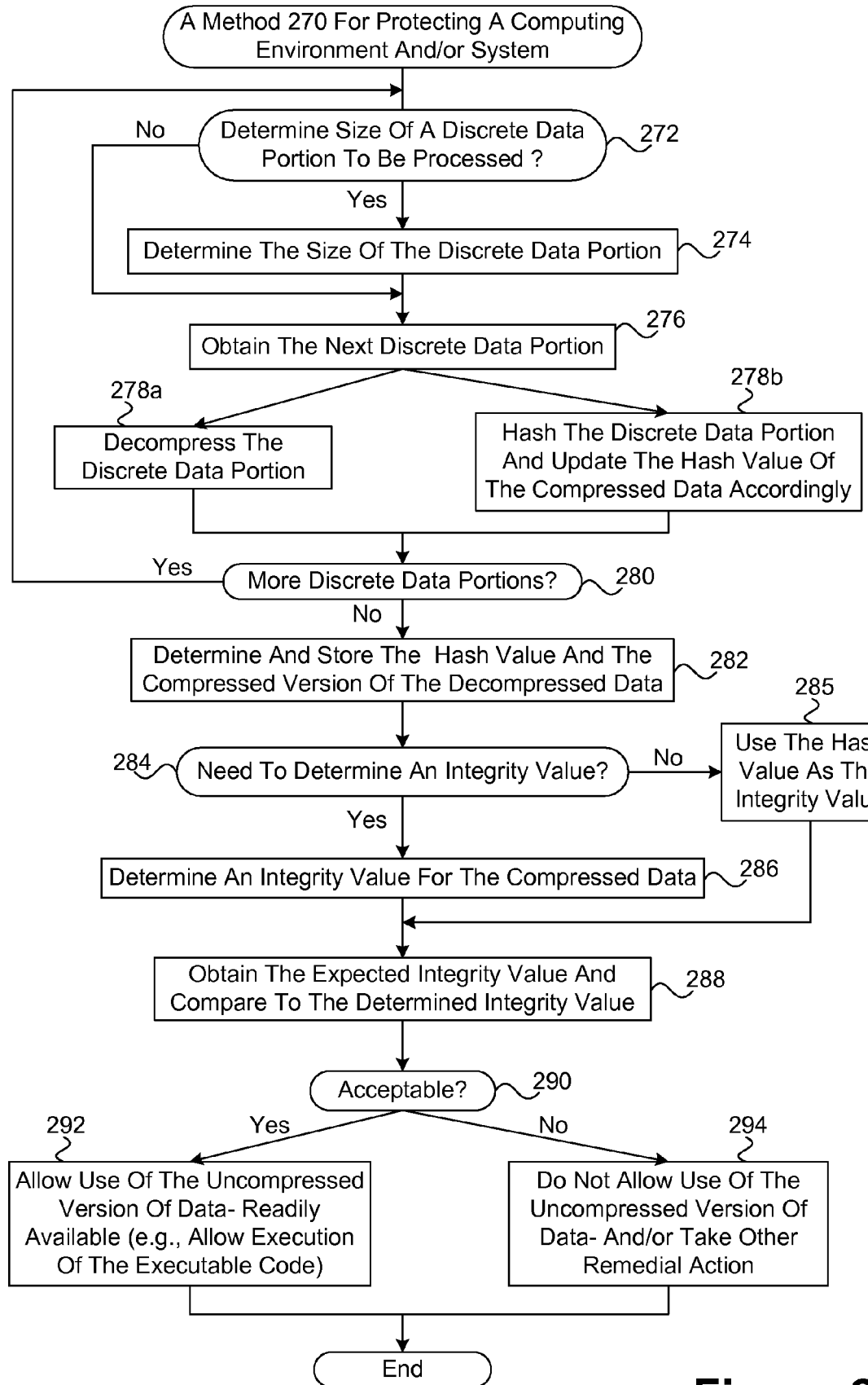
FIG. 2C depicts a method for protecting a computing environment and/or computing system in accordance with another embodiment of the invention.

FIG. 2C depicts a method 270 for protecting a computing environment and/or computing system in accordance with another embodiment of the invention. The method 270 depicts in greater detail the operations of the method 250 shown in FIG. 2B. Referring to FIG. 2C, initially, it is determined (272) whether there is need to determine the size of a discrete data portion of the compressed data to be processed. As noted above, compressed data can, for example, be effectively divided (or partitioned) into equal sizes corresponding to the size of data used to a specific hash algorithm. However, it is possible to divide the compressed data into different or variable sizes that can, for example, based on various other criteria including the size of buffer or cache currently processing available to the system, and so on. In any case, if it is determined (272) that there is a need to determine the size of the discrete data portion to be processed, the size of the discrete data portion can be determined (274). Thereafter, the data portion (or next data portion) is obtained (276). It should be noted that the method 270 operates to process each one of the discrete data portions of the compressed data, one by one and in sequence. In other words, initially, the first discrete data portion is obtained and processed before the second data portion is obtained and processed, and so on until the last discrete data portion is obtained and processed. Referring to FIG. 2C, each discrete data portion is decompressed (278a) and hashed (278b). Hashing (278b) of the discrete data portion typically includes updating the hash value of the compressed data. In effect, the method 270 can process each one of the discrete data portions that make up the compressed data, one by one and in sequence (or in turn) until it is determined (280) that the compressed data has been completely processed.

When it is determined (280) that there is no discrete data portion to process, a hash value (or final hash value) and a compressed version of the compressed data can be determined and stored in a secure storage (282). Next, it is determined (284) whether there is a need to determine an integrity value for the compressed data based on the hash value. Accordingly, an integrity value can be determined (282) based on the hash value. By way of example, the hash value can be transformed or mapped to an integrity value and/or encrypted prior to integrity verification. Alternatively, the hash value can represent and be used (285) as an integrity value. In any case, after an integrity value has been determined, an expected integrity value is obtained and compared to the determined integrity value which typically represents the current integrity value (or measurement) of the compressed data. Consequently, if it is determined (290) that the determined integrity value is acceptable, the use of the decompressed version of the data which is readily available is allowed (292) before the method 270 ends. However, if it is determined that the determined integrity value is not acceptable (e.g., not equal or not within an acceptable range), the use of the decompressed version of data is not allowed and/or other remedial actions can be taken (294) before the method 270 ends.

As noted above, the Integrity Hashing and Decompression System (IHDS) 100 can be useful in verification of integrity of a computing system and/or computing environment. As such, the IHDS 100 can serve as a component of an integrity verification system provided for a safe computing environment and/or computing system (e.g., a Trusted computing environment and/or a Trusted computing system including, for example, various Trusted computing devices that are available today or can be made available in the future).

Figure 3:
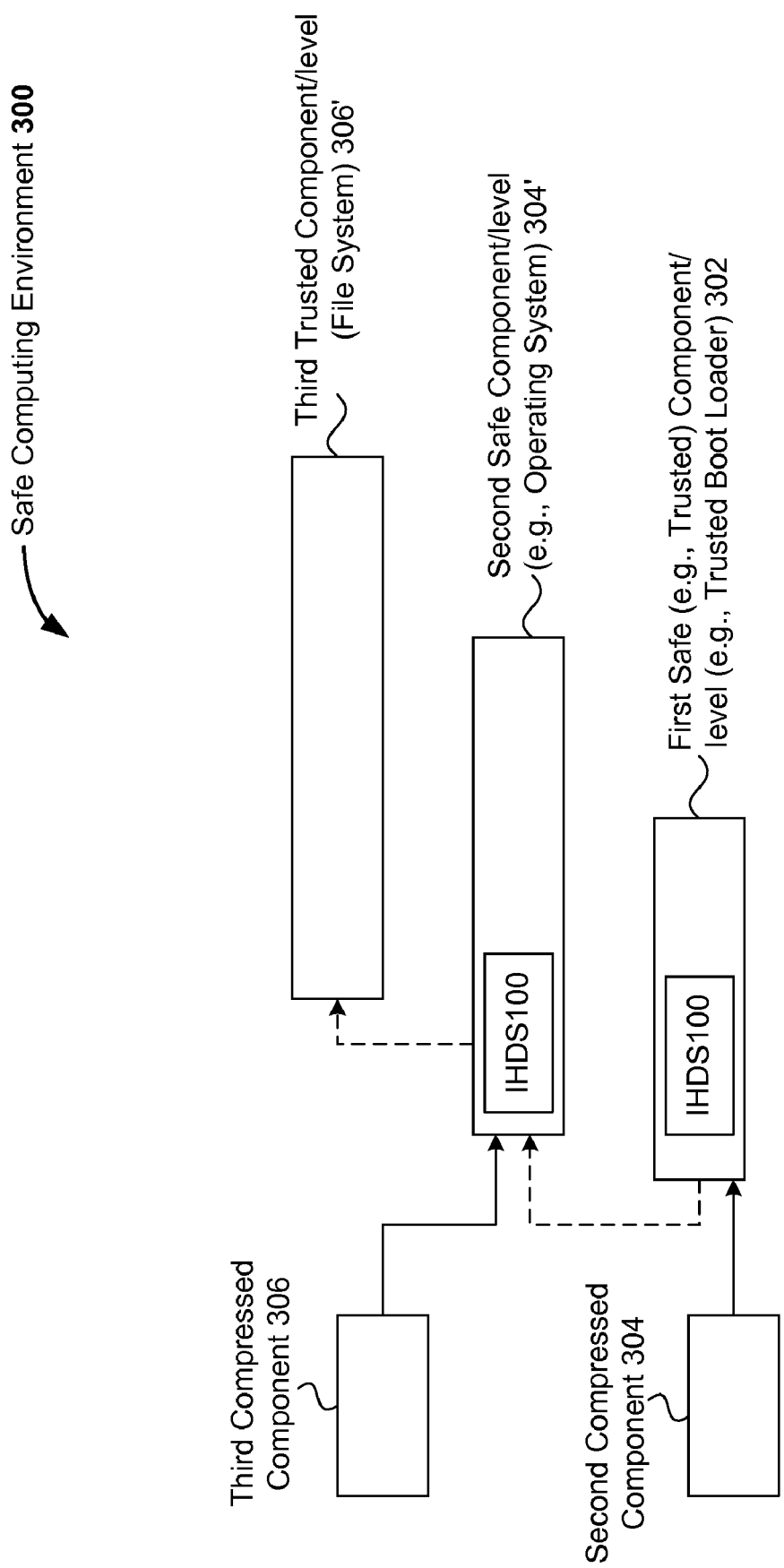
FIG. 3 depicts a safe computing environment and/or computing system in accordance with one embodiment of the invention.

To further elaborate, FIG. 3 depicts a safe computing environment and/or computing system 300 in accordance with one embodiment of the invention. The safe computing environment and/or computing system 300 can, for example, represent a Trusted Computing (TC) environment and/or computing system, as will be known to those skilled in the art. Referring to FIG. 3, an Integrity Hashing and Decompression System (IHDS) 100 is provided for the first safe component and/or first level of the safe computing environment 300. By way of example, the first safe component and/or first level 302 can be a trusted boot loader of a trusted computing environment. As will be known to those skilled in the art, a trusted boot loader can effectively verify the integrity of various other components of a trusted computing environment after its own safety or integrity has been verified. Referring back to FIG. 3, the first safe component 302 can effectively use the IHDS 100 in order to effectively verify the integrity of the compressed component 304 and decompress it to determine a decompressed version 304' before allowing its use and/or execution in the safe computing environment 300 as the second safe component and/or second level 304'. By way of example, the second compressed component 304 can be an operating system which is effectively verified by a trusted boot loader before it is executed as a trusted operating system. The second safe component 304' can effectively use the IHDS 100 to verify the integrity of the third compressed component 306, as well as determining its decompressed version 306' before allowing it to be used and/or executed in the safe computing environment 300. By way of example, the third compressed component 306 can represent a compressed file system verified and mounted by a trusted operating system 304', and so on.

Figure 4:
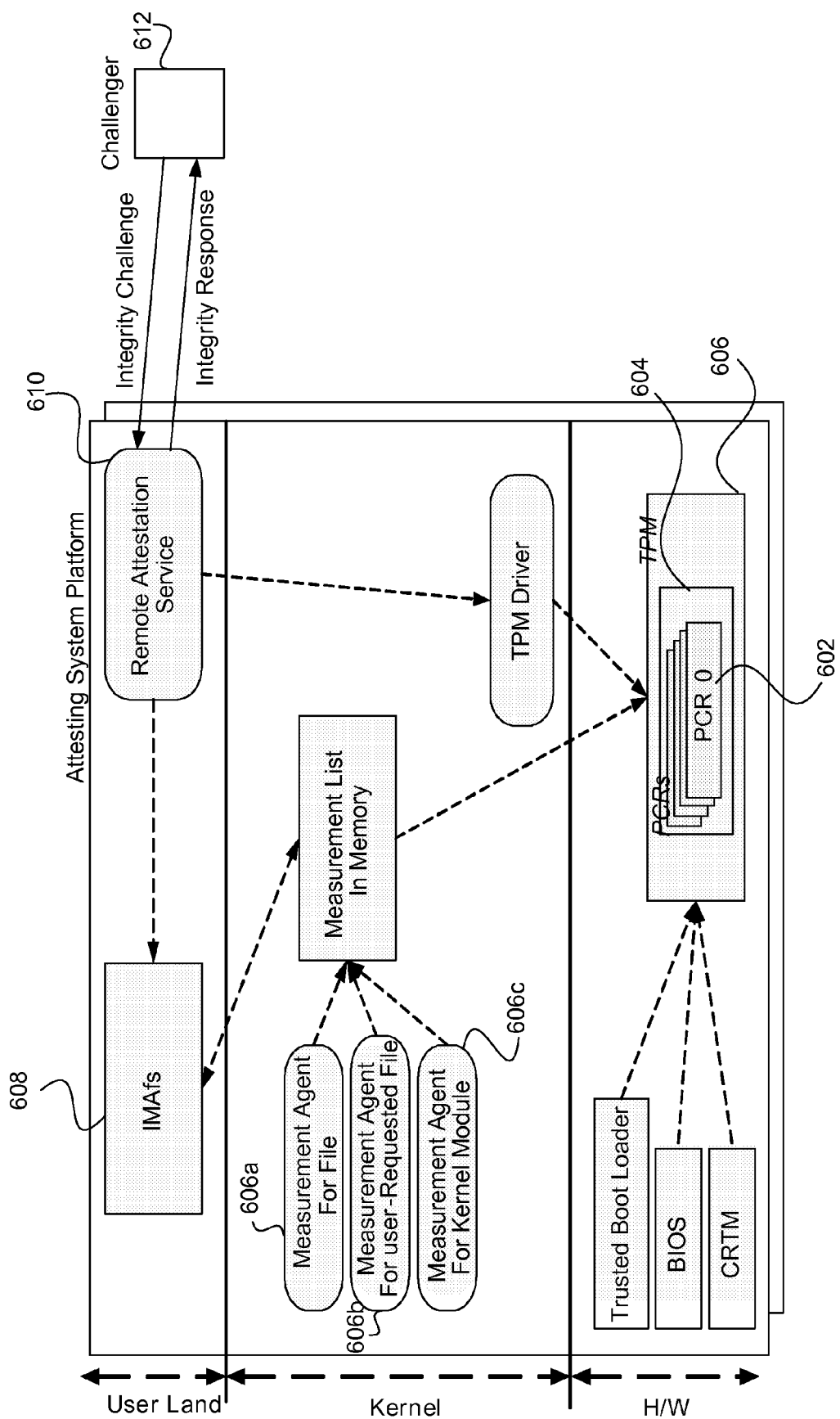
FIG. 4 depicts a computing system that can have an integrated hashing and decompression mechanism in order to verify the integrity of data accordance with one embodiment of the invention.

FIG. 4 depicts a computing system 600 that can use an integrated hashing and decompression mechanism in order to verify the integrity of data in accordance with one embodiment of the invention. Referring to FIG. 6, integrity values 602 can be securely stored by a Trusted Platform Module (TPM) 604 and used to effectively verify the integrity of various operating components including trusted boot loader and Basic Input Output System (BIOS). As will be known to those skilled in the art, various measurement agents 606 for files, user-requested files, and kernel modules can effectively operate in kernel space and communicate with Integrity Measurement Agents 608 for remote attestation services to respond to integrity challenges issued by a another system (challenger system) 612.

Figure 5:
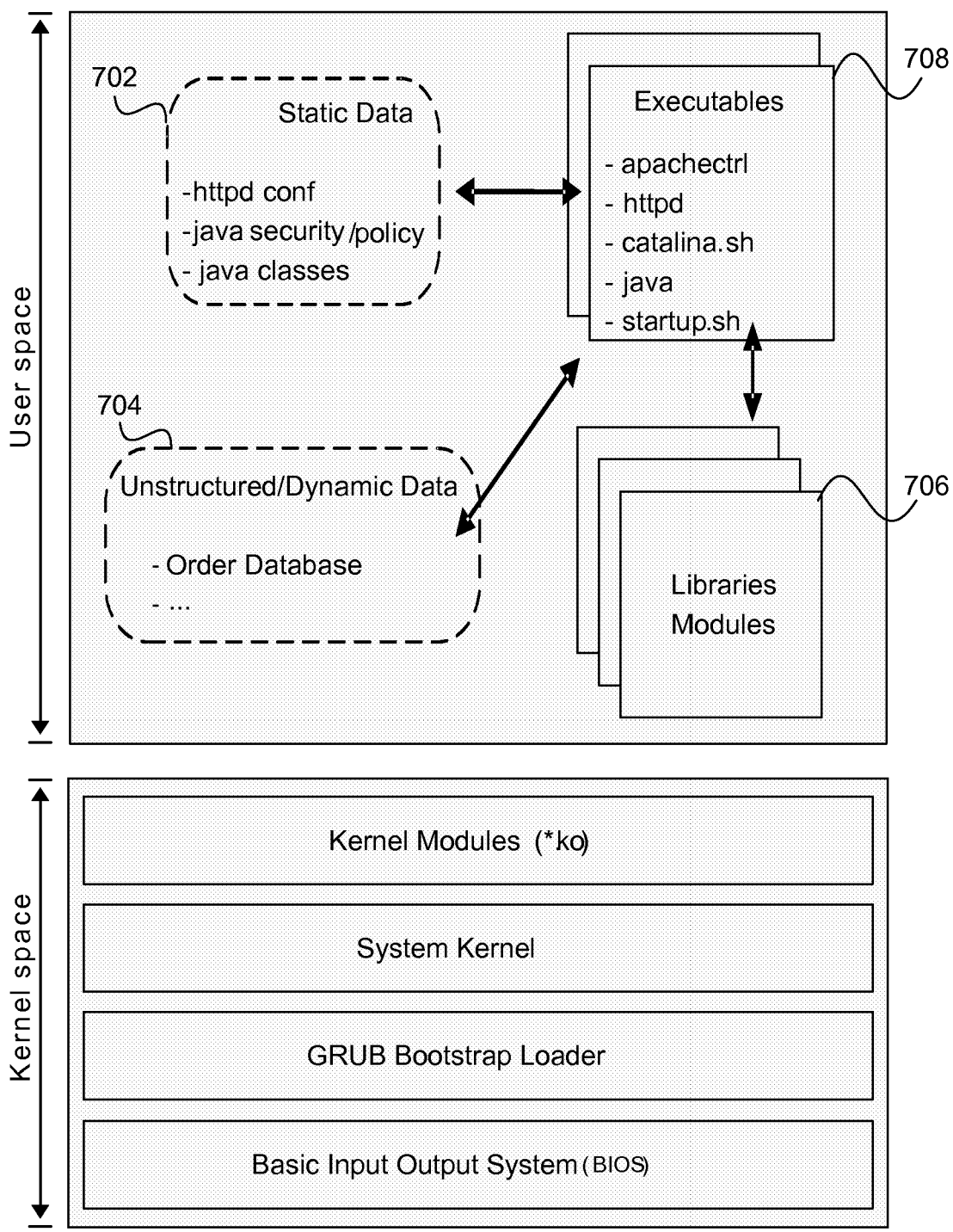
FIG. 5 depicts a computing environment including content that can be represented by verifiable representative data in accordance with one embodiment of the invention.

FIG. 5 depicts a computing environment 700 including content that can be verified in accordance with one embodiment of the invention. The computing environment 700 can, for example, represent a web server computing environment. Referring to FIG. 5, those skilled in the art will readily appreciate that various content including static data 702, unstructured/dynamic data 704 and library modules 706 and corresponding executables 708 can be effectively be verified in accordance with the techniques of the invention described above.

The various aspects, features, embodiments or implementations of the invention described above can be used alone or in various combinations. The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A computer-implemented method of hashing and decompressing compressed data, wherein said computer-implemented method comprises:
    (a) determining, based on a first discrete portion of said compressed data, a first hash value for said compressed data;
    decompressing said first discrete portion of said compressed data before considering a second discrete portion of said compressed data in determining a second hash value for said compressed data;
    (b) determining, based on said second discrete portion of said compressed data, said second hash value for said compressed data after said determining (a) of said first hash value and said decompressing of said first discrete portion of said compressed data; and
    decompressing said second discrete portion of said compressed data after said determining (a) of said first hash value and said decompressing of said first discrete portion of said compressed data, thereby effectively hashing and decompressing said compressed data at the same time to allow determining a final hash value and a decompressed version of said compressed data effectively at the same time.

2. The computer-implemented method of claim 1, wherein said computer-implemented method further comprises:
    determining said final hash value and said decompressed version of said compressed data.

3. The computer-implemented method of claim 1,
    wherein said final hash value represents an integrity value for said compressed data, and
    wherein said computer-implemented method further comprises:
        verifying the integrity of said compressed data based on said final hash value.

4. The computer-implemented method of claim 3, wherein said computer-implemented method further comprises one or more of the following:
    using said decompressed version of said compressed data after said verifying successfully verifies said integrity of said compressed data; and
    using said decompressed version of said compressed data only if said verifying successfully verifies said integrity of said compressed data.

5. The computer-implemented method of claim 1, wherein said compressed data includes one or more the following: executable code, one or more files, one or more file systems, operating system code, boot code, and static data.

6. The computer-implemented method of claim 1, wherein said computer-implemented method further comprises:
- obtaining said compressed data; and
- effectively dividing said compressed data into a plurality of discrete data portions.

7. The computer-implemented method of claim 6, wherein said compressed data is effectively divided or partitioned into a plurality of discrete data portions of the same size.

8. The computer-implemented method of claim 6, wherein said compressed data is divided or partitioned into a plurality of discrete data portions of different sizes.

9. The computer-implemented method of claim 1, wherein said compressed data is divided into a plurality of discrete data portions in accordance with and/or in compliance with a specific hashing function used to hash said compressed data.

10. The computer-implemented method of claim 9, wherein said specific hashing function is a SHA hashing function.

11. The computer-implemented method of claim 10, wherein said specific hashing function is of the following hashing functions: SHA-0, SHA-1, SHA-224, SHA-256, SHA-384 and SHA-512.

12. The computer-implemented method of claim 1, wherein said determining (a) of said first hash value and said decompressing of said first discrete portion of said compressed data are performed in parallel.

13. A computing system, wherein said computing system is operable to:
- determine, based on a first discrete portion of said compressed data, a first hash value for said compressed data;
- decompress said first discrete portion of said compressed data before considering a second discrete portion of said compressed data in determining a second hash value for said compressed data;
- determine, based on said second discrete portion of said compressed data, said second hash value for said compressed data after said determining said first hash value and said decompressing of said first discrete portion of said compressed data; and
- decompress said second discrete portion of said compressed data after said determining of said first hash value and said decompressing of said first discrete portion of said compressed data, thereby effectively hashing and decompressing said compressed data at the same time to allow determining a final hash value and a decompressed version of said compressed data effectively at the same time.

14. The computing system of claim 13, wherein said computing system is further operable to:
- determine a final hash value and a decompressed version of said compressed data.

15. The computing system of claim 14,
wherein said final hash value represents an integrity value for said compressed data, and
wherein said computing system is further operable to:
- verify the integrity of said compressed data based on said final hash value.

16. A computer-implemented method of protecting the integrity of a computing environment and/or computing system, said computer-implemented method comprising:
- decompressing and hashing each one of a plurality of discrete portions of compressed data, one by one and in sequence, in order to determine a final hash value for said compressed data and a decompressed version of said compressed data effectively at the same time;
- determining based on said final hash value whether said compressed data has maintained its integrity; and
- allowing use of said decompressed version of said data in said computing environment and/or system when said determining determines that said compressed data has maintained its integrity.

17. The computer-implemented method of claim 16, wherein use of said decompressed data version comprises one or more of the following:
- loading said decompressed version;
- executing said decompressed version;
- accessing said decompressed version; and
- allowing said decompressed version of data to be accessed.

18. The computer-implemented method of claim 17, wherein said allowing use of said decompressed version only allows use of said decompressed version only when said determining determines that said compressed data has maintained its integrity.

19. A computer readable medium including executable computer program code embodied in a tangible form for integrated hashing and decompressing of compressed data, wherein said computer readable medium includes:
- executable computer program code for processing each one of a plurality of compressed data portions of said compressed data, one by one, in order to determine a final hash value for said compressed data and a decompressed version of said compressed data effectively at the same time.

20. The computer readable medium of claim 19, wherein said executable computer program code for processing each one of a plurality of compressed data portions of said compressed data includes:
- executable computer program code for a combined initialization or pre-processing function for initialization of both hashing and decompression of said compressed data;
- executable computer program code for a combined hash-update and decompress function for hashing and decompression of each of a plurality of said compressed data; and
- executable computer program code for a combined completion or post-processing function for completion of both hashing and decompression of said compressed data.

* * * * *